United States Patent
Meir et al.

(10) Patent No.: US 9,568,971 B2
(45) Date of Patent: Feb. 14, 2017

(54) SOLID STATE DRIVE WITH SELF-REFRESH POWER SAVING MODE

(71) Applicant: APPLE INC., Cupertino, CA (US)

(72) Inventors: Avraham Poza Meir, Herzlia Pituach (IL); Evan R. Boyle, Cupertino, CA (US); Christopher J. Sarcone, Cupertino, CA (US); Barak Rotbard, Herzlia Pituach (IL)

(73) Assignee: APPLE INC., Cupertino, CA (US)

( * ) Notice: Subject to any disclaimer, the term of this patent is extended or adjusted under 35 U.S.C. 154(b) by 126 days.

(21) Appl. No.: 14/614,425

(22) Filed: Feb. 5, 2015

(65) Prior Publication Data
US 2016/0231797 A1   Aug. 11, 2016

(51) Int. Cl.
| | |
|---|---|
| *G06F 3/06* | (2006.01) |
| *G06F 1/30* | (2006.01) |
| *G06F 1/32* | (2006.01) |
| *G11C 5/14* | (2006.01) |
| *G11C 11/406* | (2006.01) |
| *G11C 14/00* | (2006.01) |
| *G11C 11/4074* | (2006.01) |

(52) U.S. Cl.
CPC .............. *G06F 1/30* (2013.01); *G06F 1/3275* (2013.01); *G06F 1/3287* (2013.01); *G06F 3/0625* (2013.01); *G06F 3/0655* (2013.01); *G06F 3/0679* (2013.01); *G11C 5/148* (2013.01); *G11C 11/40615* (2013.01); *G11C 14/0018* (2013.01); *G11C 11/4074* (2013.01)

(58) Field of Classification Search
CPC ........ G06F 1/30; G06F 1/3275; G06F 1/3287; G06F 3/0625; G06F 3/0655; G11C 5/148; G11C 11/40615; G11C 11/4074; G11C 14/0018

USPC ............ 711/103, 154, 156, 158; 365/185.33; 713/320, 323, 324
See application file for complete search history.

(56) References Cited

U.S. PATENT DOCUMENTS

| | | | |
|---|---|---|---|
| 5,805,910 A | 9/1998 | Lee et al. | |
| 7,058,835 B1 * | 6/2006 | Sullivan | G06F 1/30 713/300 |
| 8,588,017 B2 * | 11/2013 | Park | G11C 11/40618 365/185.12 |
| 8,766,707 B1 * | 7/2014 | Younger | G06F 1/3287 327/534 |

(Continued)

FOREIGN PATENT DOCUMENTS

EP      1828901 A2    9/2007

OTHER PUBLICATIONS

International Application # PCT/US15/65928 Search Report dated Mar. 7, 2016, pp. 1-8.

(Continued)

*Primary Examiner* — Stephen Elmore
(74) *Attorney, Agent, or Firm* — D.Kligler IP Services LTD.

(57) ABSTRACT

A storage device includes a non-volatile memory, a volatile memory and a controller. The volatile memory supports a normal mode and a self-refresh mode. The controller is configured to store data for a host in the non-volatile memory while using the volatile memory in the normal mode and, in response to receiving a power-down command from the host, to deactivate at least part of the storage device and to switch the volatile memory from the normal mode to the self-refresh mode.

17 Claims, 1 Drawing Sheet

(56) References Cited

U.S. PATENT DOCUMENTS

| | | | | |
|---|---|---|---|---|
| 8,924,785 B2* | 12/2014 | Meir | ................... | G06F 11/1441 |
| | | | | 714/24 |
| 8,959,369 B2* | 2/2015 | de Cesare | ............. | G06F 1/3203 |
| | | | | 345/52 |
| 9,015,506 B2* | 4/2015 | Park | ................... | H04N 1/00885 |
| | | | | 713/320 |
| 9,043,630 B2* | 5/2015 | Park | ...................... | G06F 1/3203 |
| | | | | 713/300 |
| 2010/0162020 A1* | 6/2010 | Maule | ...................... | G11C 5/04 |
| | | | | 713/324 |
| 2012/0054479 A1* | 3/2012 | Park | ...................... | G06F 1/3203 |
| | | | | 713/2 |
| 2012/0099389 A1* | 4/2012 | Park | ................. | G11C 11/40618 |
| | | | | 365/200 |
| 2012/0284550 A1* | 11/2012 | Park | ................... | H04N 1/00885 |
| | | | | 713/323 |
| 2013/0265604 A1 | 10/2013 | Yokoyama | | |
| 2013/0283079 A1* | 10/2013 | Puthiyedath | .......... | G06F 1/3234 |
| | | | | 713/323 |
| 2014/0149770 A1* | 5/2014 | Ahmad | ................. | G06F 1/3228 |
| | | | | 713/323 |
| 2014/0226400 A1 | 8/2014 | Kimura | | |
| 2015/0082099 A1* | 3/2015 | Meir | ................... | G06F 11/1441 |
| | | | | 714/47.3 |
| 2015/0098102 A1* | 4/2015 | Park | ................... | H04N 1/00885 |
| | | | | 358/1.13 |

OTHER PUBLICATIONS

International Application # PCT/US15/65928 Search Report dated Sep. 2, 2016.

* cited by examiner

SOLID STATE DRIVE WITH SELF-REFRESH POWER SAVING MODE

TECHNICAL FIELD

Embodiments described herein relate generally to data storage, and particularly to low-power modes in storage devices.

BACKGROUND

Various host systems, such as mobile and personal computers, comprise storage devices for persistent storage of data. Storage devices may comprise, for example, Solid State Drives (SSDs) based on Flash memory.

SUMMARY

An embodiment that is described herein provides a storage device including a non-volatile memory, a volatile memory and a controller. The volatile memory supports a normal mode and a self-refresh mode. The controller is configured to store data for a host in the non-volatile memory while using the volatile memory in the normal mode and, in response to receiving a power-down command from the host, to deactivate at least part of the storage device and to switch the volatile memory from the normal mode to the self-refresh mode.

In some embodiments, the volatile memory includes a Dynamic Random Access Memory (DRAM). In an embodiment, the controller is configured to deactivate a primary interface between the storage device and the host in response to receiving the power-down command, and to receive from the host a wake-up command over a wake-up interface that is separate from the primary interface.

In some embodiments, the controller is configured to activate the at least part of the storage device and to switch the volatile memory to the normal mode in response to receiving a wake-up command from the host. In an example embodiment the controller is configured to recover content of the volatile memory from the non-volatile memory in response to detecting that a power interruption occurred while the volatile memory was in the self-refresh mode. In another embodiment, in response to detecting that a power interruption occurred while the volatile memory was in the self-refresh mode, the controller is configured to decide whether or not to recover the content of the volatile memory from the non-volatile memory depending on a duration of the power interruption. In yet another embodiment, the controller is configured to back-up the content of the volatile memory to the non-volatile memory prior to switching to the self-refresh mode, and, in response to the wake-up command, to decide whether or not to recover the content of the volatile memory from the non-volatile memory.

In some embodiments, the storage device further includes a back-up power source configured to provide temporary electrical power to the volatile memory at least while the volatile memory is in the self-refresh mode. In an embodiment, in response to the power-down command, the controller is configured to switch the volatile memory to the self-refresh mode and then send an acknowledgement to the host, and to deactivate the at least part of the storage device in response to receiving a deactivation instruction from the host.

There is additionally provided, in accordance with an embodiment that is described herein, a method for data storage in a storage device that includes a non-volatile memory and a volatile memory that supports a normal mode and a self-refresh mode. Data is stored data for a host in the non-volatile memory while using the volatile memory in the normal mode. In response to receiving a power-down command from the host, at least part of the storage device is deactivated and the volatile memory is switched from the normal mode to the self-refresh mode.

There is further provided, in accordance with an embodiment that is described herein, a system including a host and a storage device. The storage device includes a non-volatile memory, a volatile memory that supports a normal mode and a self-refresh mode, and a controller. The controller is configured to store data for the host in the non-volatile memory while using the volatile memory in the normal mode and, in response to receiving a power-down command from the host, to deactivate at least part of the storage device and to switch the volatile memory from the normal mode to the self-refresh mode.

These and other embodiments will be more fully understood from the following detailed description of the embodiments thereof, taken together with the drawings in which:

DETAILED DESCRIPTION OF EMBODIMENTS

Overview

Figure 1:
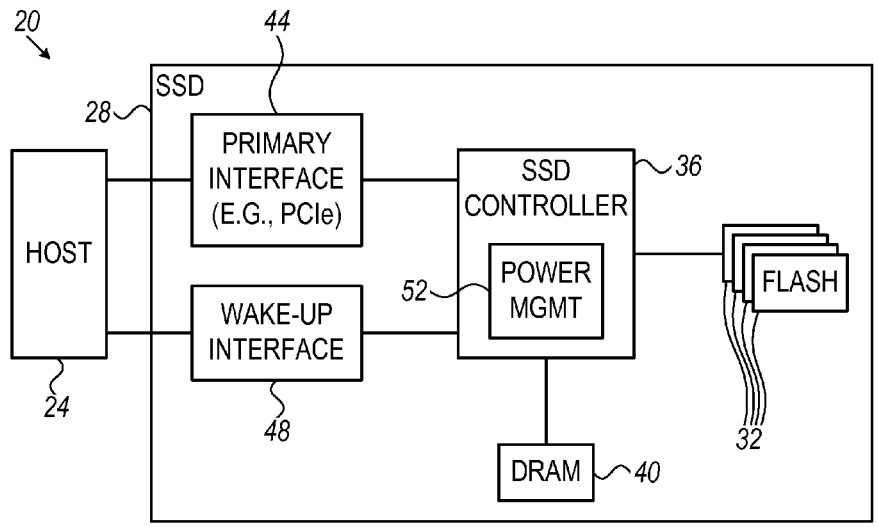
FIG. 1 is a block diagram that schematically illustrates a host system, in accordance with an embodiment that is described herein.

Embodiments that are described herein provide improved methods and systems for reducing power consumption in storage devices. The embodiments described herein refer mainly to Solid State Drives (SSDs), but the disclosed techniques can be used with various other suitable types of storage devices.

In the disclosed embodiments, a storage device comprises a Non-Volatile Memory (NVM), a controller and a Dynamic Random Access Memory (DRAM) or other volatile memory. In a normal mode of operation, the controller communicates with a host and stores data for the host in the NVM, while using the DRAM for temporary storage of data, management data structures and/or other relevant information.

In addition to the normal mode, the storage device supports a power-saving mode in which most of the storage device circuitry is deactivated, and the DRAM is set to self-refresh mode. In self-refresh, most of the DRAM functions are suspended to minimize power consumption, and the DRAM merely refreshes its memory cells periodically to retain the content stored therein.

The disclosed technique enables extremely fast transitions between the power-saving and normal modes. Since the DRAM content is retained by the self-refresh mechanism, there is no need for the controller to flush the DRAM content to the NVM before switching to the power-saving mode, and no need to retrieve the DRAM content back from the NVM on wake-up.

Moreover, there is no need for the host to re-discover or enumerate the storage device on wake-up. The storage device may simply retain the enumeration values used before switching to the power-saving mode. There is also no need for the system to re-calibrate the host-SSD interface on wake-up, since the calibration values may be recovered from the DRAM.

Furthermore, since the DRAM content is not flushed to the NVM, the disclosed technique reduces the wearing of NVM cells and increases the NVM lifetime. This advantage is particularly significant in host systems such as mobile computers, which alternate frequently between power-saving and normal operation.

Transitions into and out of the disclosed power-saving mode are typically decided and triggered by the host. The host usually has the most accurate information regarding present and future activity of the SSD, imminent power interruptions and other factors that affect the decisions to enter or exit the power-saving mode. Explicit control of the power-saving mode by the host maximizes power saving, and helps to apply proper hysteresis and avoid unnecessary toggling between modes.

In an embodiment, the storage device and the host support a separate wake-up interface, in addition to the primary interface used for data storage and retrieval. In this embodiment, the host instructs the storage device to switch to the power-saving mode using the primary interface, but the instruction to wake-up is sent using the separate wake-up interface. This feature enables the storage device to shut down the primary interface in the power-saving mode, and further reduce power consumption.

In some embodiments, the power-saving mode has two sub-modes. A first sub-mode enables fast wake-up even if power failure occurred during the power-save period. A second sub-mode does not provide this guarantee, and requires slower wake-up that involves recovering the DRAM content from the NVM.

System Description

FIG. 1 is a block diagram that schematically illustrates a host system 20, in accordance with an embodiment that is described herein. System 20 comprises a host 24 that stores data in a Solid State Drive (SSD) 28. In an example embodiment, system 20 comprises a personal or mobile computer, or a mobile computing or communication device, and host 24 comprises a Central Processing Unit (CPU) of the computer or device.

In alternative embodiments, system 20 may comprise any other suitable type of system that stores data, such as an enterprise storage system. Alternatively to SSD, system 20 may use any other suitable type of storage device that stores data in Non-Volatile Memory (NVM).

In the embodiment of FIG. 1, SSD 28 comprises one or more Flash devices 32 or other suitable NVM devices, and a controller 36 that communicates with host 24 and stores data in Flash devices 32. Controller 36 communicates with host 24 using a primary interface 44, and a separate wake-up interface 48. In an example embodiment, primary interface 44 comprises a Peripheral Component Interconnect-Express (PCIe) interface, and wake-up interface 48 comprises a discrete Input/Output (I/O) signal. Alternatively, interfaces 44 and 48 may comprise any other suitable interfaces.

SSD 28 further comprises a volatile memory, typically a Dynamic Random Access Memory (DRAM) 40. DRAM 40 may comprise, for example, one or more Double Data Rate (DDR) devices, Single Data Rate (SDR) DRAM, low power DDR (LPDDR), or any other suitable type of DRAM.

DRAM 40 supports a self-refresh mode, in which most of the DRAM functions are suspended to reduce power consumption. In the self-refresh mode, the DRAM typically ignores storage and readout commands, and merely refreshes its memory cells periodically to retain the content stored therein. The refreshing cycles are typically managed by internal timing circuitry in the DRAM. The DRAM clock may also be disabled when operating in this mode. Some DRAM devices support "selective self-refresh"—A mode in which only a selected portion of the memory is refreshed. In the present context, selective self-refresh of this sort is also regarded as a self-refresh mode.

In the embodiments described herein, controller 36 operates SSD 28 in various modes, including at least a normal mode and a self-refresh power-saving mode. Alternation between the modes, and power management in general, are carried out by a power management module 52. (The SSD may comprise additional power-saving modes that do not necessarily involve the DRAM self-refresh mechanism, but these modes are considered outside the scope of the present disclosure. The self-refresh power-saving mode is thus referred to simply as "power-saving mode" for the sake of clarity.)

The system and storage-device configurations of FIG. 1 are example configurations, which are shown purely for the sake of conceptual clarity. Alternatively, any other suitable system and storage-device configurations can also be used. Elements that are not necessary for understanding the principles of the present invention, such as various addressing circuits, timing and sequencing circuits and debugging circuits, have been omitted from the figure for clarity.

In the exemplary configuration shown in FIG. 1, memory devices 32 and SSD controller 36 are implemented as separate Integrated Circuits (ICs). In alternative embodiments, however, the memory devices and the controller may be integrated on separate semiconductor dice in a single Multi-Chip Package (MCP) or System on Chip (SoC), and may be interconnected by an internal bus. Further alternatively, some or all of the controller circuitry may reside on the same die on which one or more of the memory devices are disposed. Further alternatively, some or all of the functionality of controller 36 can be carried out by host 24, or by any other type of memory controller. In some embodiments, host 24 and controller 36 may be fabricated on the same die, or on separate dice in the same device package.

The functions of controller 36 can be implemented, for example, using software running on a suitable processor, using hardware (e.g., state machine or other logic), or using a combination of software and hardware elements. Alternatively, controller 36 may comprise one or more processors capable of executing software for carrying out the functions described herein. The software may be downloaded to the processors in electronic form, over a network, for example, or it may, alternatively or additionally, be provided and/or stored on non-transitory tangible media, such as magnetic, optical, or electronic memory.

SSD Power-saving Mode Using DRAM Self-refresh

Typically, when instructed to switch to the power-saving mode, module 52 in controller 36 sets DRAM 40 to self-refresh. The DRAM remains connected to electrical power (assuming the SSD as a whole remained powered), and the information stored in the DRAM is thus retained. The information stored in DRAM 40 may comprise, for example, cached user data, metadata, logical-to-physical address translation tables, miscellaneous temporary data, and/or any other suitable information.

Since the DRAM information remains intact, switching into and out of the power-saving mode is extremely fast. Typically, there is no need for controller 36 to flush the DRAM content to the NVM when switching to power-saving, or to retrieve the DRAM content from the NVM on wake-up. There is also no need for the host to re-discover and enumerate the SSD upon wake-up—The host may simply use the previous enumeration values.

Moreover, it may be possible for the host or the controller to skip (or at least partially skip) re-calibration of the interface between them upon wake-up, since the existing calibration values may be retained and later read from the DRAM. Such calibration values may comprise, for example, calibration of on-chip terminations of the interface lines, calibration of timing skew on the interface lines, or any other suitable calibration values.

When switching to the power-saving mode, controller 36 deactivates most of the SSD circuitry (in addition to setting the DRAM to self-refresh) in order to reduce power consumption. When exiting the power-saving mode, controller 36 re-activates the SSD circuitry so as to resume normal operation. Controller 36 may shut down one or more power rails and keep only the relevant DRAM rails and DRAM interface lock rail. The controller may also instruct the power supply of the SSD to switch to a low-power mode that is not used in normal operation, thereby gaining some power-supply efficiency.

Typically, switching into and out of the power-saving mode is dictated by host 24. The host sends to SSD controller 36 power-down commands to switch to the power-saving mode over primary interface 44. In one embodiment, host 24 communicates with controller 36 over primary interface 44 using the NVM-Express (NVMe) protocol. In this embodiment, the power-down command comprises an NVMe command.

In the embodiment of FIG. 1, host 24 instructs SSD 28 to wake-up from the power-saving mode by sending wake-up commands to controller 36 over wake-up interface 48. Since wake-up interface 48 is separate from primary interface 44, controller 36 may deactivate primary interface 44 during the power-save period, as well. This feature enables further power-saving, especially when (as in PCIe) the primary interface consumes a considerable amount of power.

Wake-up interface 48, on the other hand, in typically designed to be simple and consume little power, since it remains active during the power-saving period. In the present example the wake-up interface comprises a single-bit I/O signal. Alternatively, any other suitable interface, e.g., a simple command interface, can also be used.

Generally, however, the disclosed techniques do not mandate the use of a separate wake-up interface. In some embodiments, host 24 may send wake-up commands to SSD 28 over the primary interface, in which case interface 48 is omitted.

In some embodiments, the power-saving mode has two sub-modes. The first sub-mode guarantees fast wake-up even if power failure occurred during the power-save period. A second sub-mode does not provide this guarantee, and requires slower wake-up that involves recovering the DRAM content from the NVM.

In order to implement the first sub-mode, DRAM 40 should remain connected to electrical power regardless of whether external electrical power is available to the SSD as a whole. If this condition is met, the DRAM information remains intact even through power failures that affect the SSD. In an example embodiment, The DRAM is backed up by a back-up power source, such as a battery or a super-capacitor. The energy capacity of the back-up power source should be sufficient to last for the longest expected (or specified) power outage.

In an alternative embodiment, the power-saving mode has a hybrid sub-mode. In this sub-mode, the DRAM content is copied to the NVM prior to entering the power-saving mode, and also retained in the DRAM. If no power interruption occurs during the power-saving period (or if the power interruption was sufficiently short for the DRAM to retain its content using self-refresh) the SSD can return to normal operation rapidly, since the DRAM content is intact. Otherwise, recovery is slower and involves recovering the DRAM content from the NVM.

In an embodiment, the host may decide which sub-mode to apply based on prior knowledge of the length of an upcoming power interruption. Consider, for example, a scenario in which the host does not expect a power interruption, or expects a power interruption that is sufficiently short for the DRAM to support its self-refresh operation. In such a scenario the host may refrain from copying the DRAM content to the NVM and rely on the DRAM self-refresh. If, on the other hand, the host expects a longer power interruption, it may decide to copy the DRAM content to the NVM. Recovery to normal operation in this case may depend on the actual duration of the power interruption, as in the hybrid sub-mode described above.

Figure 2:
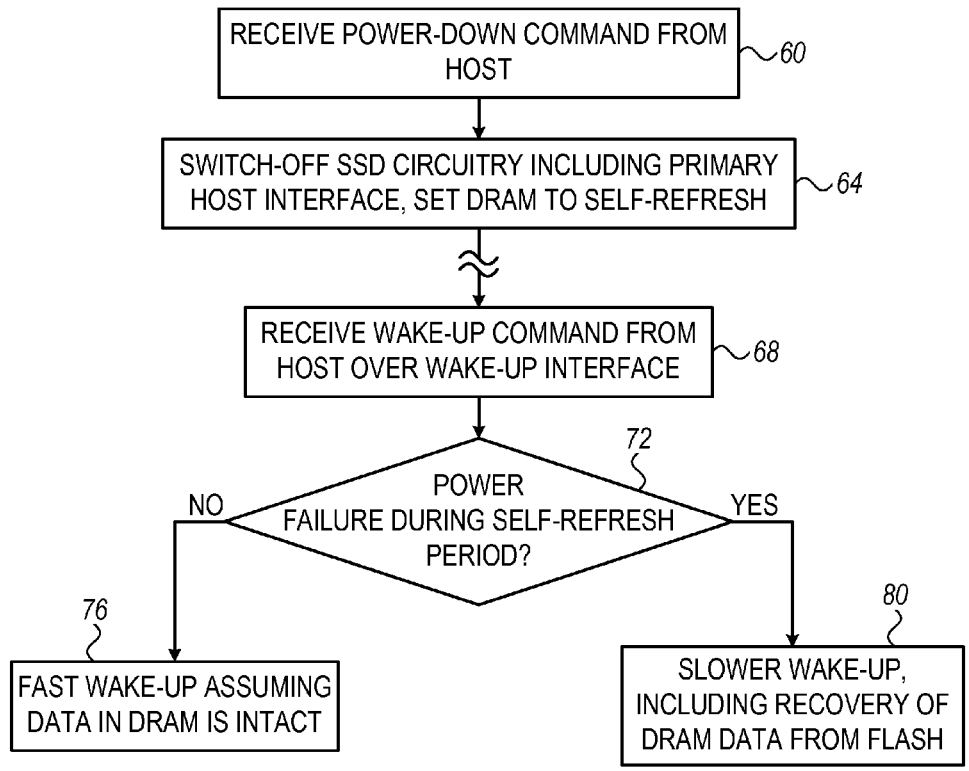
FIG. 2 is a flow chart that schematically illustrates a method for operating a Solid State Drive (SSD), in accordance with an embodiment that is described herein.

FIG. 2 is a flow chart that schematically illustrates a method for operating SSD 28, in accordance with an embodiment that is described herein. The method begins with SSD controller 36 receiving a power-down command from host 24 over primary interface 44, at a power-down instruction step 60.

In response to the power-down command, controller 36 deactivates at least part of the SSD circuitry and sets DRAM 40 to self-refresh, at a deactivation step 64. The controller may deactivate, for example, Flash devices 32, primary interface 44 and/or any other suitable SSD element. Wake-up interface 48 typically remains active in order to detect wake-up commands. At this stage, SSD 28 consumes little power.

In an alternative embodiment, controller 36 does not immediately deactivate the SSD circuitry in response to the power-down command, but only prepares for the deactivation and allows the host to trigger it. In this embodiment, after receiving the power-down command, controller 36 prepares the DRAM content for self-refresh, sets DRAM 40 to self-refresh, and acknowledges to host 24 that the SSD is ready for entering the self-refresh power-saving mode. Host 24 then instructs the SSD circuitry to shut down, e.g., using wake-up interface 48. The host may, for example, instruct the SSD power supply to shut down unnecessary power rails and enter a low-power mode.

At some later point in time, host 24 wakes up SSD 28 using wake-up interface 48, at a wake-up step 68. In response to the wake-up command, controller 36 checks whether power interruption or failure occurred during the power-save period, at a checking step 72. If not, controller 36 performs a fast wake-up process that assumes the information stored in DRAM 40 is valid, at a fast wake-up step 76.

Otherwise, controller 36 performs a slower wake-up process that assumes the information stored in DRAM 40 may be invalid, at a slow wake-up step 80. The latter process typically involves recovering the information that was stored in DRAM 40 from Flash devices 32. In both wake-up processes (steps 76 and 80), controller 36 switches DRAM 40 from self-refresh to normal operation.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A storage device, comprising:
   a non-volatile memory;
   a volatile memory that supports a normal mode and a self-refresh mode; and
   a controller, which is configured to:
      store data for a host in the non-volatile memory while using the volatile memory in the normal mode;
      in response to receiving a power-down command from the host, deactivate at least part of the storage device and switch the volatile memory from the normal mode to the self-refresh mode; and
      activate the at least part of the storage device and to switch the volatile memory to the normal mode in response to receiving a wake-up command from the host.

2. The storage device according to claim 1, wherein the volatile memory comprises a Dynamic Random Access Memory (DRAM).

3. The storage device according to claim 1, wherein, in response to detecting that a power interruption occurred while the volatile memory was in the self-refresh mode, the controller is configured to recover content of the volatile memory from the non-volatile memory.

4. The storage device according to claim 1, wherein, in response to detecting that a power interruption occurred while the volatile memory was in the self-refresh mode, the controller is configured to decide whether or not to recover content of the volatile memory from the non-volatile memory depending on a duration of the power interruption.

5. The storage device according to claim 1, wherein the controller is configured to back-up content of the volatile memory to the non-volatile memory prior to switching to the self-refresh mode, and, in response to the wake-up command, to decide whether or not to recover the content of the volatile memory from the non-volatile memory.

6. The storage device according to claim 1, and comprising a back-up power source configured to provide temporary electrical power to the volatile memory at least while the volatile memory is in the self-refresh mode.

7. The storage device according to claim 1, wherein, in response to the power-down command, the controller is configured to switch the volatile memory to the self-refresh mode and then send an acknowledgement to the host, and to deactivate the at least part of the storage device in response to receiving a deactivation instruction from the host.

8. A method for data storage, comprising:
   in a storage device that comprises a non-volatile memory (NVM) and a volatile memory that supports a normal mode and a self-refresh mode, storing data for a host in the non-volatile memory while using the volatile memory in the normal mode;
   in response to receiving a power-down command from the host, deactivating at least part of the storage device and switching the volatile memory from the normal mode to the self-refresh mode; and
   activating the at least part of the storage device and switching the DRAM to the normal mode in response to receiving a wake-up command from the host.

9. The method according to claim 8, wherein the volatile memory comprises a Dynamic Random Access Memory (DRAM).

10. The method according to claim 8, wherein activating the part of the storage device comprises, in response to detecting that a power interruption occurred while the volatile memory was in the self-refresh mode, recovering content of the volatile memory from the non-volatile memory.

11. The method according to claim 8, wherein recovering content comprises, in response to detecting that a power interruption occurred while the volatile memory was in the self-refresh mode, deciding whether or not to recover the content of the volatile memory from the non-volatile memory depending on a duration of the power interruption.

12. The method according to claim 8, wherein switching to the self-refresh mode comprises backing-up content of the volatile memory to the non-volatile memory prior to switching to the self-refresh mode, and wherein recovering the content comprises, in response to the wake-up command, deciding whether or not to recover the content of the volatile memory from the non-volatile memory.

13. The method according to claim 8, and comprising providing temporary electrical power to the volatile memory using a back-up power source, at least while the volatile memory is in the self-refresh mode.

14. The method according to claim 8, wherein switching to the self-refresh mode comprises sending an acknowledgement to the host after switching the volatile memory to the self-refresh mode, and wherein deactivating the at least part of the storage device comprises disabling the at least part of the storage device in response to receiving a deactivation instruction from the host.

15. A system, comprising:
   a host; and
   a storage device, comprising:
      a non-volatile memory;
      a volatile memory that supports a normal mode and a self-refresh mode; and
      a controller, which is configured to:
         store data for the host in the non-volatile memory while using the volatile memory in the normal mode;
         in response to receiving a power-down command from the host, deactivate at least part of the storage device, including a primary interface between the storage device and the host, and switch the volatile memory from the normal mode to the self-refresh mode; and
         receive from the host a wake-up command over a wake-up interface that is separate from the primary interface.

16. A storage device, comprising:
   a non-volatile memory;
   a volatile memory that supports a normal mode and a self-refresh mode; and
   a controller, which is configured to:
      store data for a host in the non-volatile memory while using the volatile memory in the normal mode;
      deactivate at least part of the storage device and switch the volatile memory from the normal mode to the self-refresh mode in response to receiving a power-down command from the host; and deactivate a primary interface between the storage device and the host in response to receiving the power-down command, and receive from the host a wake-up command over a wake-up interface that is separate from the primary interface.

17. A method for data storage, comprising:

in a storage device that comprises a non-volatile memory (NVM) and a volatile memory that supports a normal mode and a self-refresh mode, storing data for a host in the non-volatile memory while using the volatile memory in the normal mode; and in response to receiving a power-down command from the host, deactivating at least part of the storage device, including a primary interface between the storage device and the host, and switching the volatile memory from the normal mode to the self-refresh mode; and receiving from the host a wake-up command over a wake-up interface that is separate from the primary interface.

* * * * *